United States Patent
Liu et al.

(10) Patent No.: US 10,354,930 B2
(45) Date of Patent: Jul. 16, 2019

(54) S/D CONTACT RESISTANCE MEASUREMENT ON FINFETS

(71) Applicant: INTERNATIONAL BUSINESS MACHINES CORPORATION, Armonk, NY (US)

(72) Inventors: Zuoguang Liu, Schenectady, NY (US); Xin Miao, Guilderland, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 190 days.

(21) Appl. No.: 15/134,916

(22) Filed: Apr. 21, 2016

(65) Prior Publication Data

US 2017/0307667 A1 Oct. 26, 2017

(51) Int. Cl.
  *H01L 21/66* (2006.01)
  *G01R 27/20* (2006.01)
  *H01L 21/8234* (2006.01)
  *H01L 29/66* (2006.01)

(52) U.S. Cl.
  CPC ............ *H01L 22/30* (2013.01); *G01R 27/205* (2013.01); *H01L 22/14* (2013.01); *H01L 22/34* (2013.01); *H01L 21/823431* (2013.01); *H01L 29/66795* (2013.01)

(58) Field of Classification Search
  None
  See application file for complete search history.

(56) References Cited

U.S. PATENT DOCUMENTS

| 4,896,108 | A | 1/1990 | Lynch et al. |
| 8,796,093 | B1 | 8/2014 | Cheng et al. |
| 8,841,701 | B2 | 9/2014 | Lin et al. |
| 9,147,765 | B2 | 9/2015 | Xie et al. |
| 2008/0179635 | A1* | 7/2008 | Gossner ............ H01L 29/41758 257/241 |
| 2008/0297180 | A1 | 12/2008 | Vinet |
| 2012/0242356 | A1 | 9/2012 | Ohuchi et al. |
| 2013/0200449 | A1* | 8/2013 | Chen ................ H01L 21/82343 257/296 |
| 2014/0131777 | A1 | 5/2014 | Wong et al. |
| 2014/0319615 | A1 | 10/2014 | Chi et al. |
| 2015/0011068 | A1 | 1/2015 | Lin et al. |
| 2015/0104918 | A1 | 4/2015 | Liu et al. |
| 2015/0123146 | A1 | 5/2015 | Krishnan et al. |
| 2015/0140763 | A1 | 5/2015 | Wang et al. |
| 2015/0236016 | A1 | 8/2015 | Wann et al. |
| 2015/0279840 | A1 | 10/2015 | Huang et al. |
| 2016/0049516 | A1 | 2/2016 | Huang et al. |

(Continued)

*Primary Examiner* — Eduardo A Rodela
*Assistant Examiner* — Nilufa Rahim
(74) *Attorney, Agent, or Firm* — Tutunjian & Bitetto, PC.; Vazken Alexanian

(57) ABSTRACT

A contact resistance test device includes a set of full fins providing channels between a source region and a drain region and a set of partial fins connected to the source region. A gate structure is formed over the set of full fins and set of partial fins. A source contact is connected to the source region. A probe contact is isolated from the source contact and is connected to the source region wherein a voltage measured on the probe contact measures contact resistance when a drain-to-source current is flowing in the set of full fins.

20 Claims, 10 Drawing Sheets

(56) References Cited

U.S. PATENT DOCUMENTS

2016/0187414 A1\* 6/2016 Lin .................... G01R 31/2623
                                                        324/719
2016/0268174 A1  9/2016 Wann et al.
2017/0092555 A1  3/2017 Aono et al.
2017/0213767 A1\* 7/2017 Sung ................ H01L 21/82343

\* cited by examiner

S/D CONTACT RESISTANCE MEASUREMENT ON FINFETS

BACKGROUND

Technical Field

The present invention relates to semiconductor fabrication and testing, and more particularly to structures and methods for measuring source/drain (S/D) contact resistance of semiconductor devices.

Description of the Related Art

Precisely measuring source/drain (S/D) contact resistance is a desirable measurement for advancing fin field effect transistor (FinFET) technology. Traditional methods for measuring S/D contact resistance often lead to erroneous results. These results often measure less resistance than the actual resistance value.

Ideally, $V_{meas}$ is a potential of a highly doped S/D epitaxial structure. Therefore, contact resistance can be calculated as $R_c = V_{meas}/I_{ds}$ (where $I_{ds}$ is the drain-source current). If a contact lands too deeply into the epitaxial region (S/D region), a sense fin is then in contact with both the contact and the epitaxial region (S/D region) resulting in a large contact surface area. In such a case, $V_{meas}$ would be an averaged potential between the contact and the epitaxial region (S/D region). $V_{meas}$ could become much smaller than the epitaxial potential, resulting in erroneously small $R_c$.

SUMMARY

A contact resistance test device includes a set of full fins providing channels between a source region and a drain region and a set of partial fins connected to the source region. A gate structure is formed over the set of full fins and set of partial fins. A source contact is connected to the source region. A probe contact is isolated from the source contact and is connected to the source region wherein a voltage measured on the probe contact measures contact resistance when a drain-to-source current is flowing in the set of full fins.

Another contact resistance test device includes a semiconductor substrate, a set of full fins etched into the substrate and a set of partial fins etched from the set of full fins. A source region is epitaxially grown on first end portions of the set of full fins and the set of partial fins, and a drain region is epitaxially grown on second end portions of the set of full fins. The full fins form channels between the source region and the drain region. A gate structure is formed over the set of full fins and the set of partial fins. A source contact is connected to the source region corresponding to the set of full fins. A probe contact is connected to the source region corresponding to the set of partial fins, the probe contact being isolated from the source contact wherein a voltage measured on the probe contact measures contact resistance when a drain-to-source current is flowing in the set of full fins.

A method for fabricating a contact resistance test device includes forming a set of full fins; cutting a subset of the set of full fins to form a set of partial fins; forming a gate structure over the set of full fins and set of partial fins; epitaxially growing a source region over a first end of the set of full fins and the set of partial fins and forming a drain region over a second end of the set of full fins; forming an interlevel dielectric (ILD) layer over the source region and the drain region; etching contacts holes in the ILD layer and into the source region and the drain region; and forming a source contact to the first end of the set of full fins, a drain contact to the second end of the set of full fins and a probe contact to the first end of the set of partial fins for measuring contact resistance.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
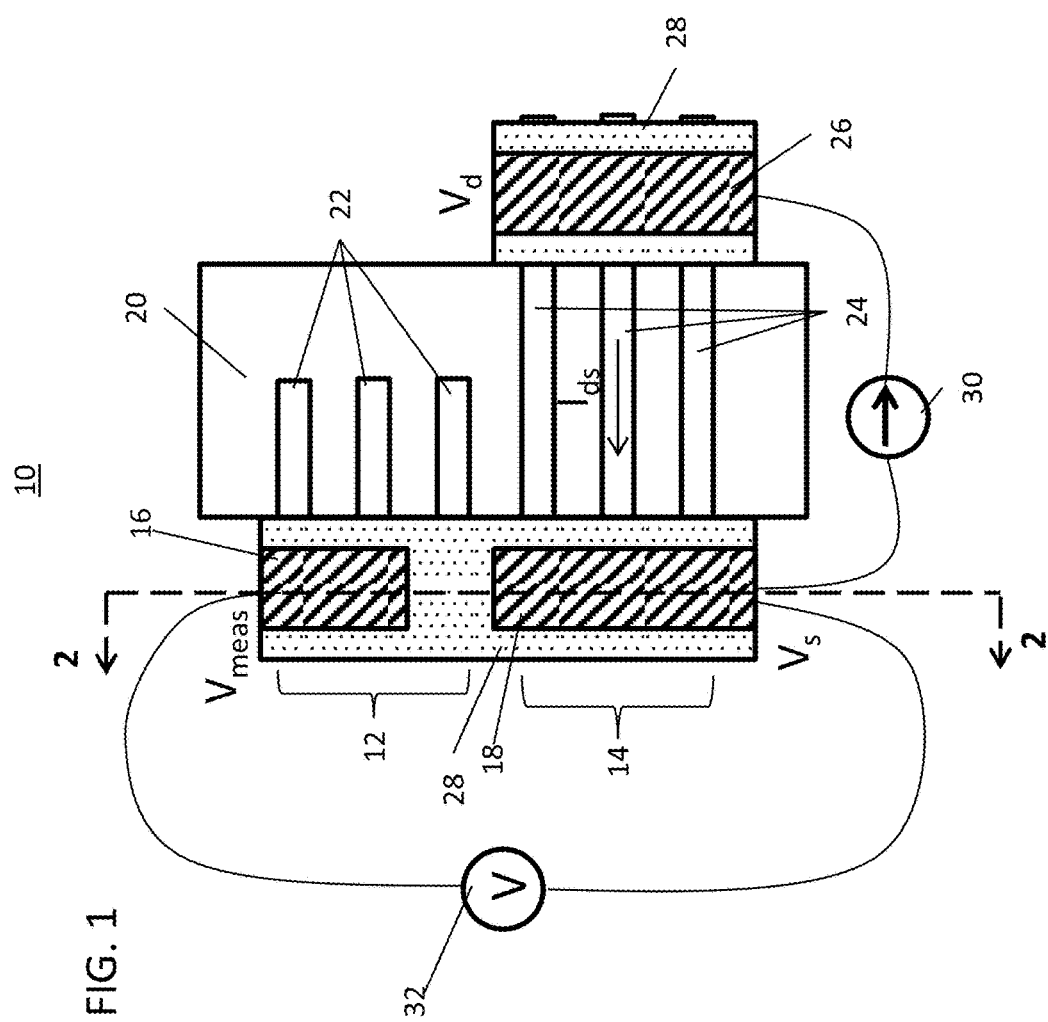
FIG. 1 is a top view of test device and device under test in accordance with the present principles.

In accordance with the present principles, structures and methods for fabricating the structures are provided for building a testing device. In useful embodiments, the testing device includes a full fin field effect transistor (finFET) along with a half finFET to measure contact resistance. The testing device may be formed on each chip or may be formed on one or more chips of a wafer to provide data for all chips on the wafer. The testing device provides a same structure at a probe point as a source region for the device under test. In addition, equal potential is provided at the probe point and the source region to ensure greater test measurement accuracy.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integer, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or features) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Figure 2:
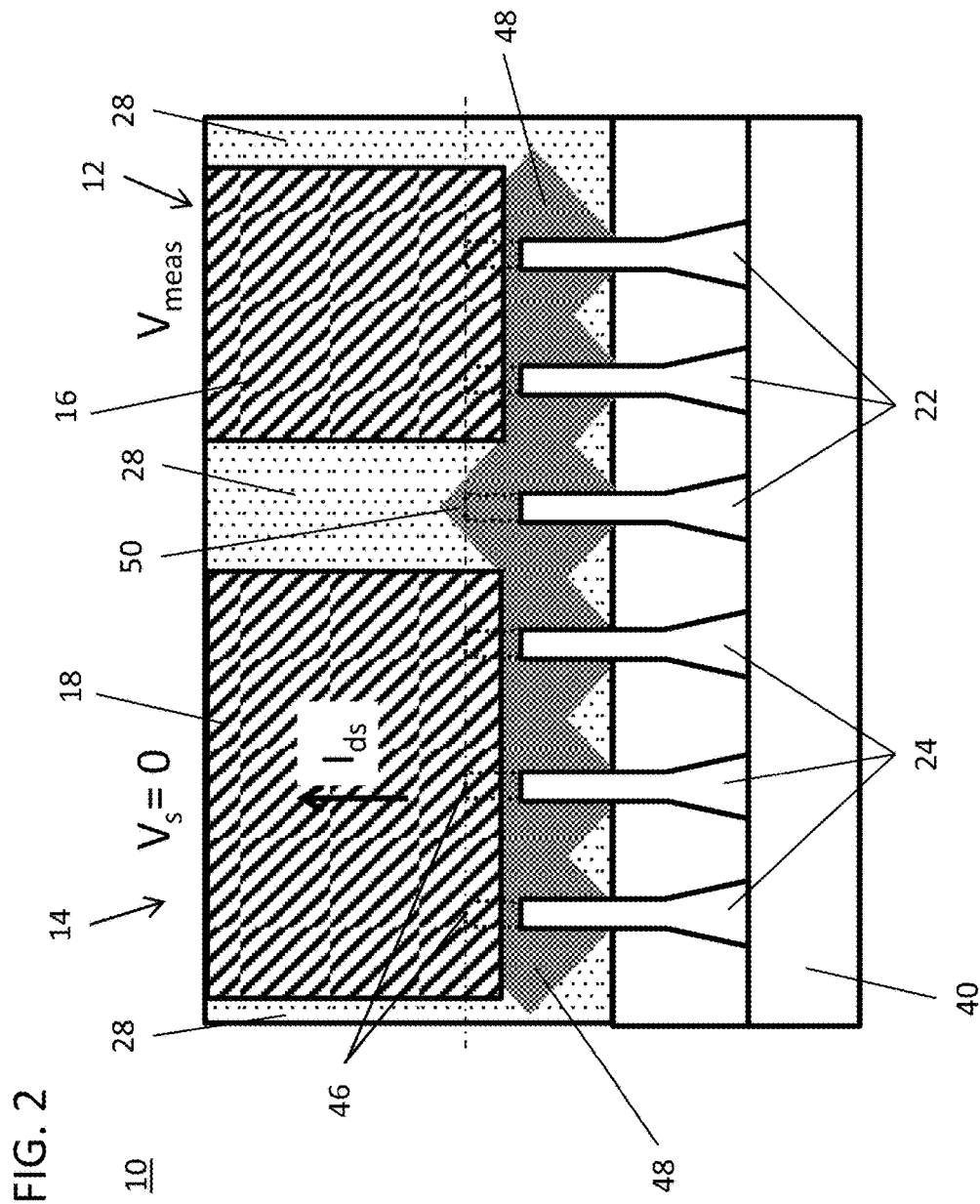
FIG. 2 is a cross-sectional view of the test device and device under test taken at section line 2-2 in FIG. 1 in accordance with the present principles.

Referring now to the drawings in which like numerals represent the same or similar elements and initially to FIGS. 1 and 2, a testing structure or device 10 is shown for measuring contact resistance in accordance with the present principles. The structure 10 is shown as a top view in FIG. 1 and a cross-sectional view in FIG. 2 taken at section line 2-2 in FIG. 1. The structure 10 includes a combination of full fins 24 and half fins 22 formed on or from a substrate 40. A shallow trench isolation region 42 may be formed at a base of the fins 22, 24. The fins 24 include a full structure of a fin field effect (finFET) transistor device 14 as a device under test (DUT) for which the contact resistance will be measured. The full finFET or DUT 14 includes a source region 48 connected to a contact 18, a drain region connected to (and below) a contact 26 and a channel region passing therebetween through the fins 24. The source region 48 includes a merged S/D epitaxial structure (merged together from adjacent fins). The half finFET 12 includes a same source region 48 connected to a contact 16 and connecting to fins 22. There is no drain for the half finFET 12. The half finFET 12 forms a probe for measuring the contact resistance of the full finFET 14.

A gate structure 20 is formed over the fins 22 and fins 24 between the source and drain regions. The contacts 16, 18 and 26 are encapsulated in a dielectric material 28, e.g., an interlevel dielectric (ILD). It should be understood that the ILD may not present between gate 20 and contacts 16, 18, 26. Contacts 16, 18 and 26 can instead be isolated from gate metal by a gate spacer. A same potential is provided for epitaxial source region 48 for a probe point at contact 16. The probe point at contact 16 has a same potential as the source epitaxial structure 48 of the DUT 14.

A voltage is measured as represented by a voltmeter symbol 32 which connects the contact 16 to the contact 18. A current is forced through the full finFET or DUT 14 as represented by a current source 30. This creates a drain to source current ($I_{ds}$) to flow through the fins 24. The source voltage ($V_s$) is held at zero ($V_s$=0) so that a voltage can be measured by a probe from contact 16 when the gate structure 20 is activated with a threshold voltage. Because of the partial fin structure, no current can flow from the source region 48 of DUT 14 (that is, region 48 under contact 18) to contact 16. Therefore, no potential difference exists between the source region 48 of DUT 14 and contact 16. The measured voltage ($V_{meas}$) at contact 16 is obtained and represents the contact resistance of the DUT 14. The contact resistance $R_c = V_{meas}/I_{ds}$ (where $I_{ds}$ is the drain-source current).

Since the epitaxial source regions 48 are the same for the source contact 18 and the probe contact 16, the issue with contacts being formed too deeply into the epitaxial regions is eliminated. The half fins 22 need to fall within the width of the gate structure 20.

Portions 46 of the fins 22, 24 are removed in the source regions 48 associated with contacts 16, 18 and 26, but remain to the full height 44 through the width of the gate structure 20 and for portion 50 between the contact regions 16 and 18.

The test device 10 may be configured on each finFET chip, a portion of the finFETs or may be configured on one or more chips on a wafer. In this way, the contact resistance of a device or of a device on a chip may be tested to represent the contact resistance across the rest of the chip or the rest of the wafer.

The source contact 18 and the probe contact 16 connect to the epitaxially grown region (source region) over the set of full fins 24 and the set of partial fins 22. This avoids the contacts 16, 18 from running alongside of the fins 24, which causes problems in conventional structures where measured contact resistance is erroneously measured due to the inclusion of the contact with the fin.

Figure 3:
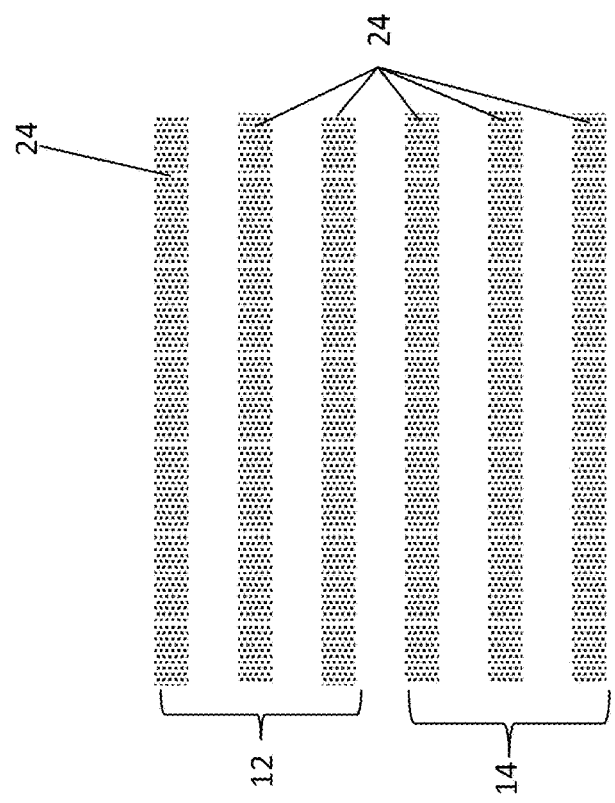
FIG. 3 is a top view showing fins formed for the test device and the device under test in accordance with the present principles.

Referring to FIG. 3, the formation of the test device 10 may begin with the formation of fins 24 on a substrate 40 (FIG. 2). The substrate 40 includes a semiconductor material, such as, e.g., Si, SiGe, SiC, Ge, III-V materials, etc. The fins 24 may be formed by patterning a mask and etching. The etch mask may include resist or other materials, and the patterning may include lithography, spacer image transfer (SIT) or other techniques. The fins 24 are etched in accordance with the etch mask to form appropriate dimensions (e.g., height, width).

Figure 4:
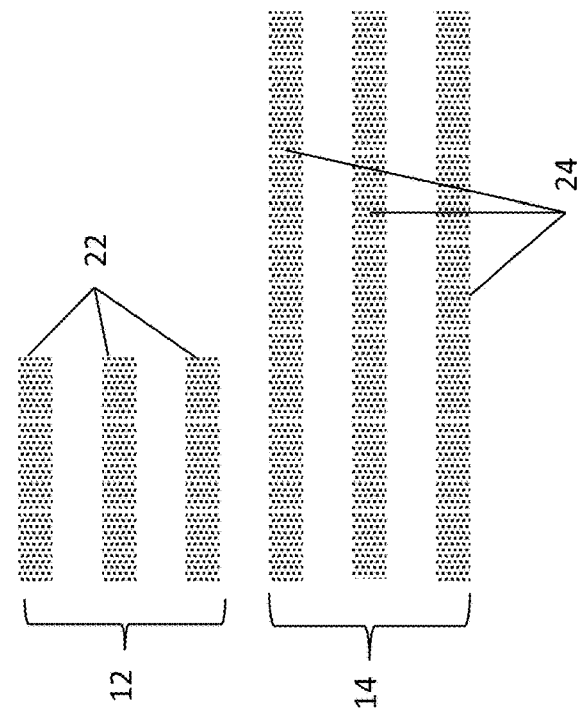
FIG. 4 is a top view showing partial fins formed from the full fins of FIG. 3 for the test device in accordance with the present principles.

Referring to FIG. 4, a block mask (not shown) is formed over the fins 24, and a portion of some of the fins 24 is removed to form half fins 22. In one embodiment, the top three fins 24 in an array of fins are etched to form half fins 22. These top six fins in the array may be employed for forming the testing device 10. Other fins may be employed and not every device needs to have a test device 10 formed thereon.

Figure 5:
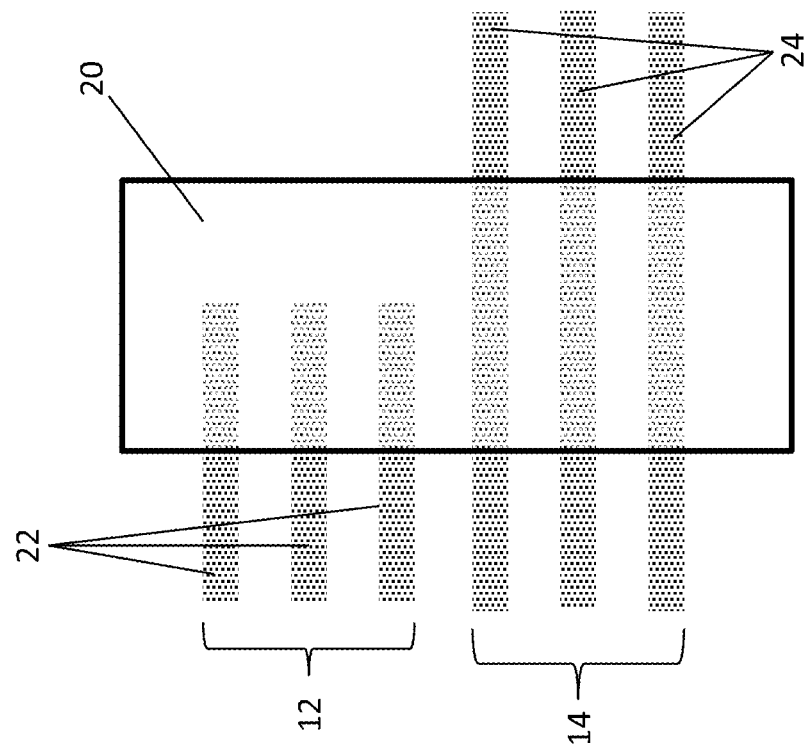
FIG. 5 is a top view showing a gate structure formed over the partial fins and the full fins of FIG. 4 in accordance with the present principles.

Referring to FIG. 5, a gate structure 20 is formed over the fins 22 and 24. The fins 22 need to fall within the width of the gate structure 20. The gate structure 20 includes a gate dielectric, and one or more conductive layers, sidewall spacers and a gate cap. The gate structure 20 may take on many forms. The gate structure 20 may include any known gate structure.

The gate conductor for structure 20 includes conductive materials, such as, e.g., polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

The gate structure 20 is formed such that an edge of cut probe fins 22 are within its width. A wider gate structure 20 may be employed and may be needed to ensure this condition.

Figure 6:
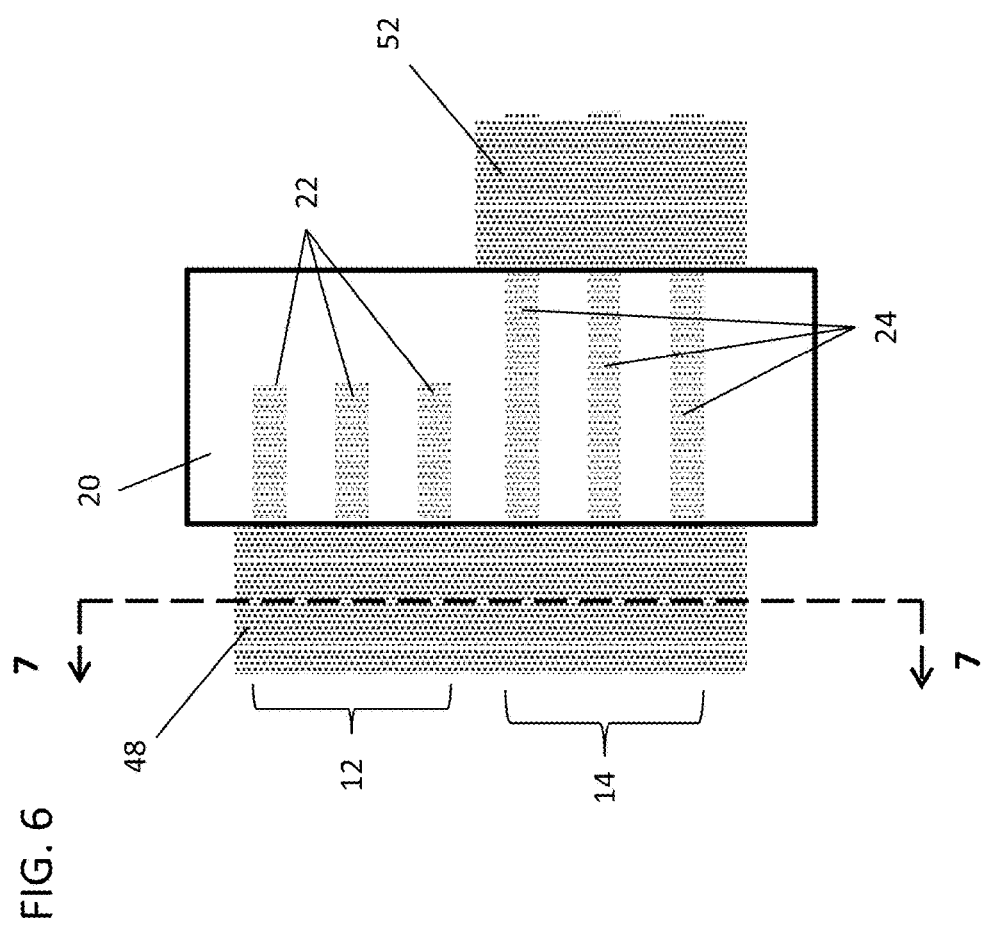
FIG. 6 is a top view of the test device and device under test showing epitaxially grown source and drain regions in accordance with the present principles.
Figure 7:
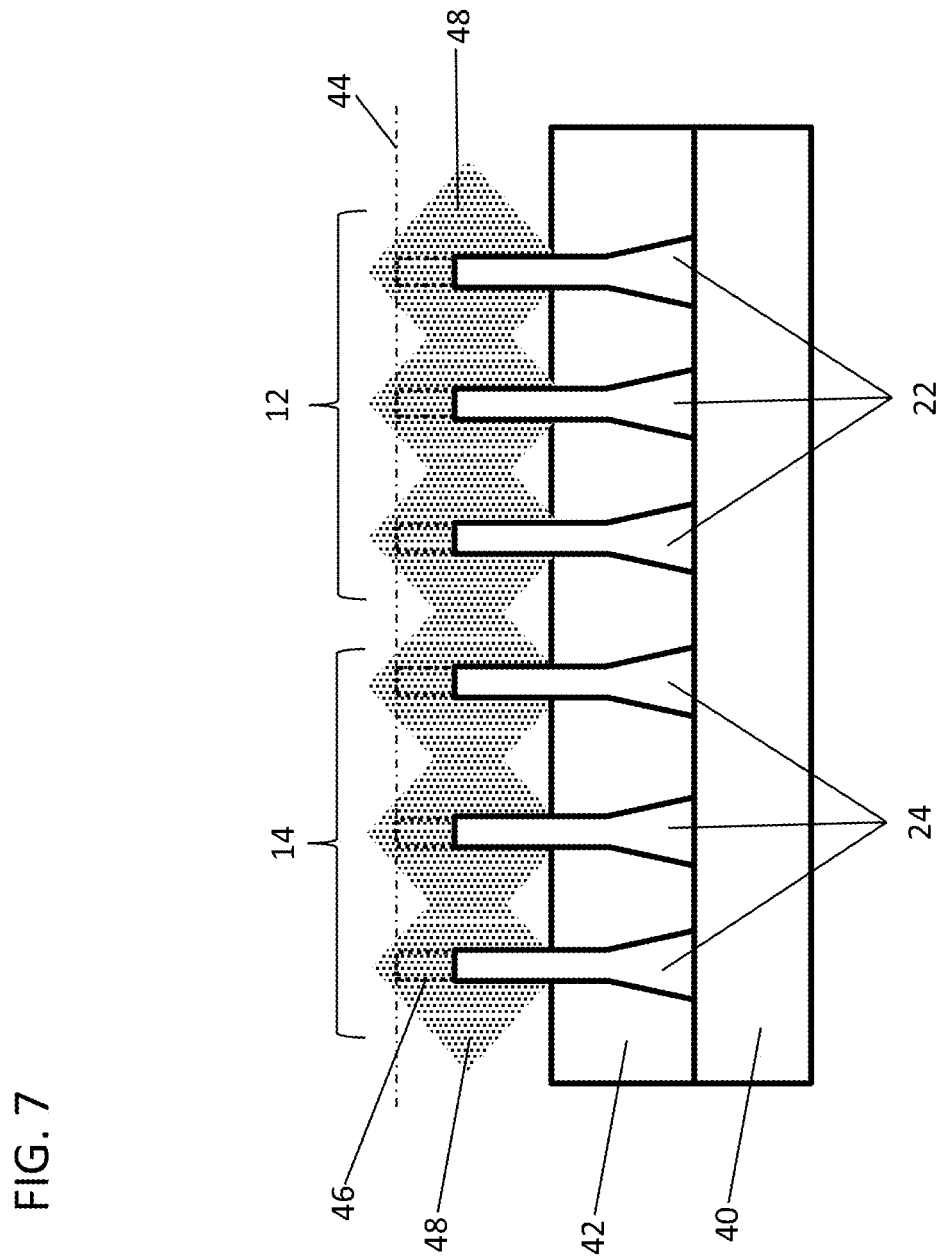
FIG. 7 is a cross-sectional view of the test device and the device under test taken at section line 7-7 in FIG. 6 in accordance with the present principles.

Referring to FIGS. 6 and 7, source region 48 and drain region 52 (collectively S/D regions) are formed by epitaxial growth as shown in a top view in FIG. 6. A cross-sectional view taken at section line 7-7 in FIG. 6 is shown in FIG. 7 including source region 48 for the DUT 14 and the probe 12. Source region 48 and drain region 52 are epitaxially grown on the fins 22, 24.

S/D epitaxy can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from about $1 \times 10^{19}$ cm$^{-3}$ to about $2 \times 10^{21}$ cm$^{-3}$, or preferably between $2 \times 10^{20}$ cm$^{-3}$ and $1 \times 10^{21}$ cm$^{-3}$. When Si:C is epitaxially grown, the Si:C layer may include carbon in the range of 0.2 to 3.0%. When SiGe is epitaxially grown, the SiGe may have germanium content in the range of 5% to 80%, or preferably between 20% and 60%.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

Figure 8:
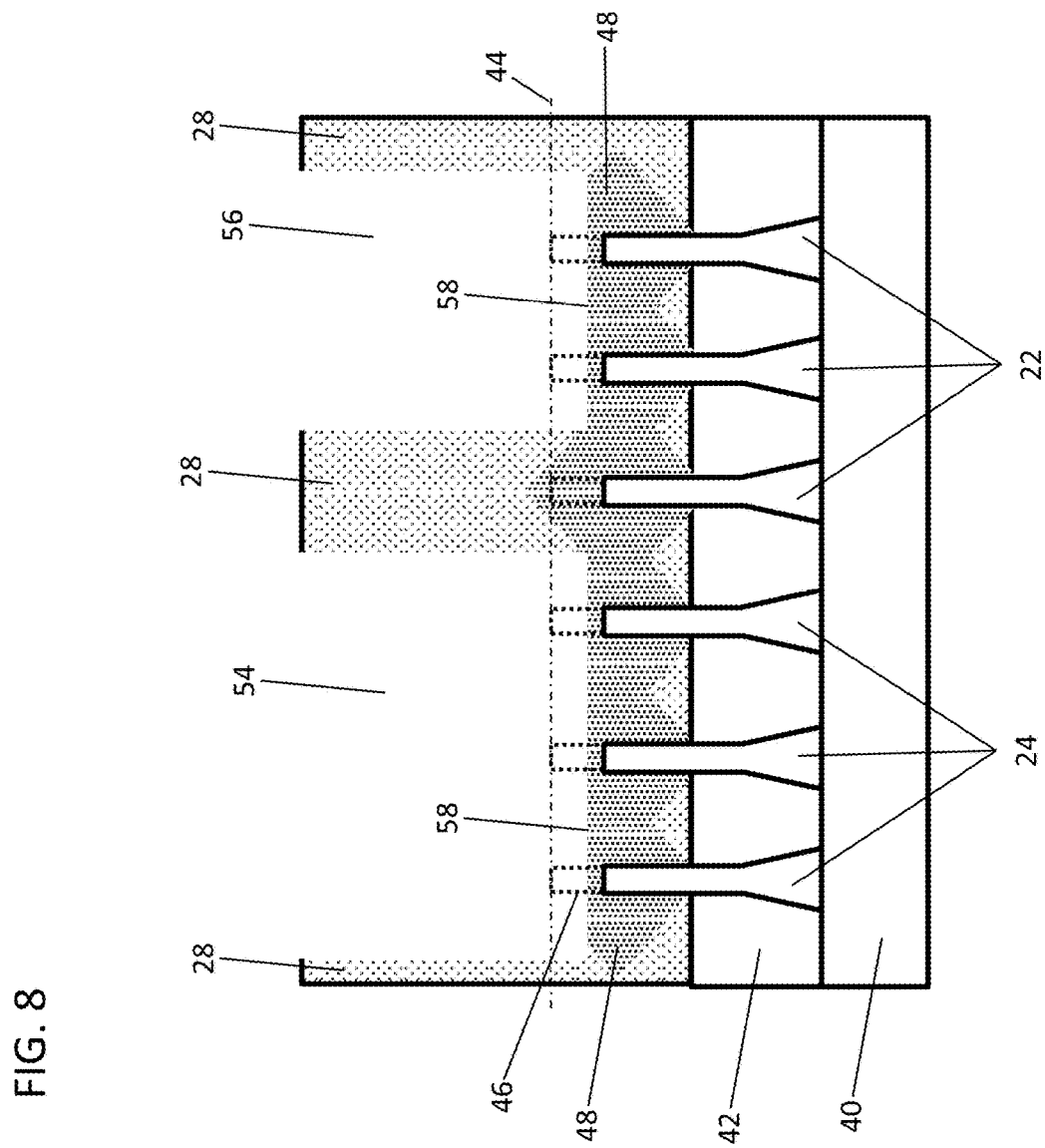
FIG. 8 is a cross-sectional view of the test device and device under test showing an interlevel dielectric layer patterned to form contact holes and to etch portions of the epitaxially grown source and drain regions in accordance with the present principles.

Referring to FIG. 8, an interlevel dielectric (ILD) 28 is formed over and below the source region 48 and the drain region 52. The ILD 28 may include any suitable dielectric materials, e.g., a silicon oxide, nitride, etc. The ILD 28 is patterned to form openings 54 and 56. Opening 54 corresponds with the source region 48 of the DUT 14, and the opening 56 corresponds with the probe 12. The openings 54 and 56 are formed by an etch process, e.g., a reactive ion etch (RIE). The RIE removes the ILD down to the epitaxy regions and removes portions of the epitaxy regions to form surfaces 58. The openings 54 and 56 provide contact holes patterned by the RIE to expose and form the epitaxial regions within the contact holes.

Figure 9:
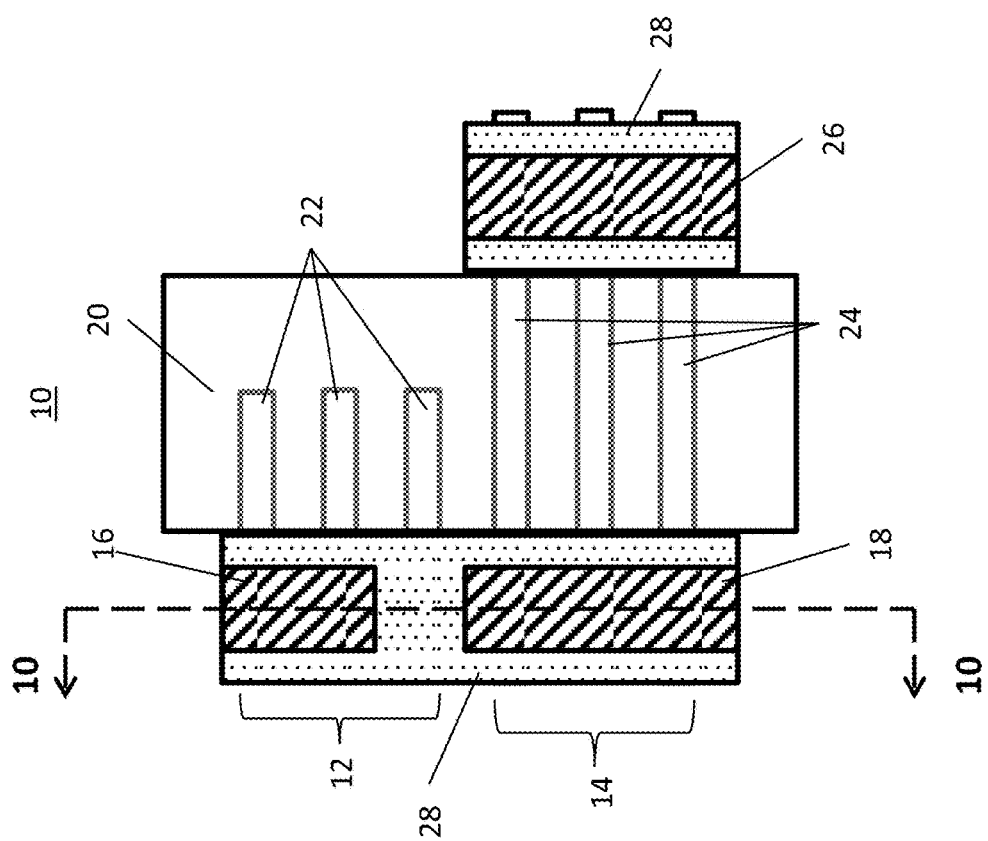
FIG. 9 is a top view of the test device and device under test of FIG. 8 showing source, probe and drain contacts in accordance with the present principles.
Figure 10:
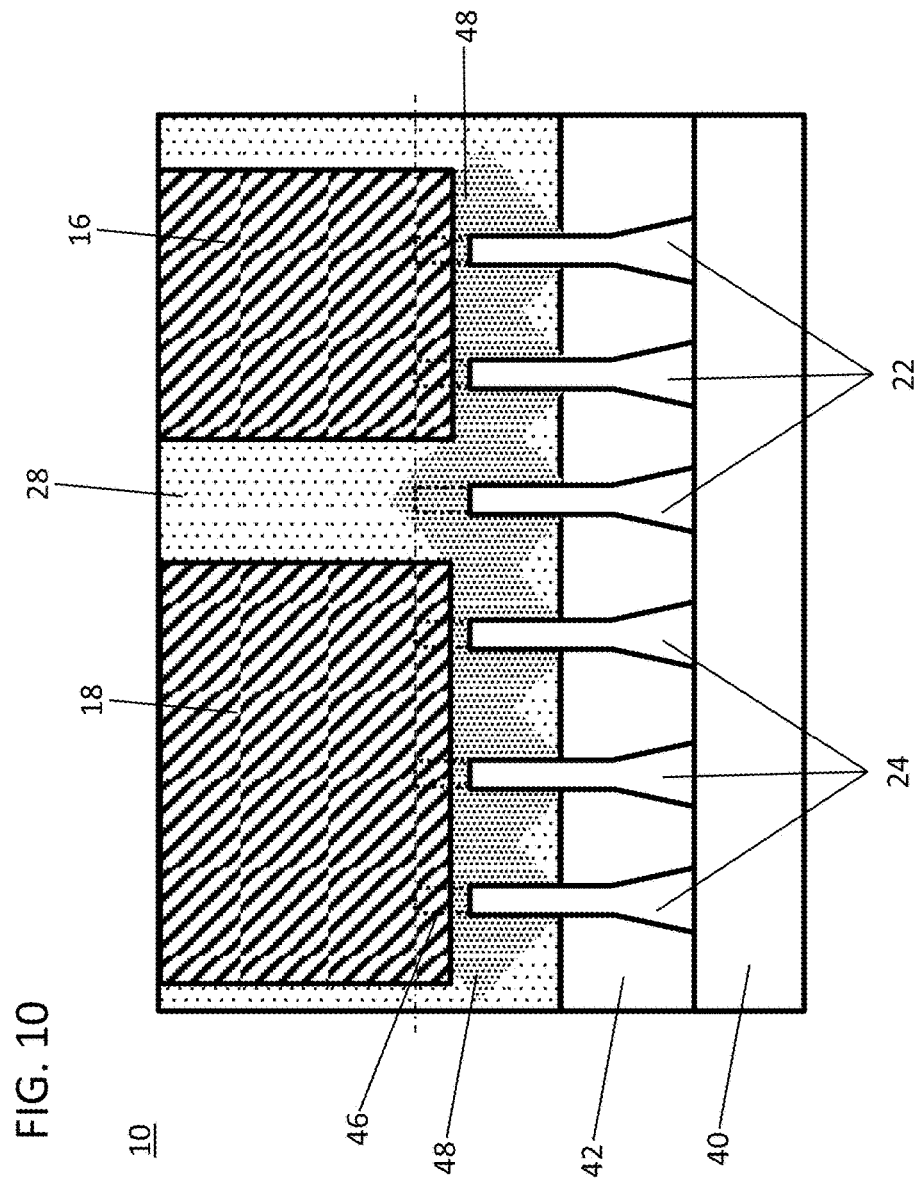
FIG. 10 is a cross-sectional view of the test device and the device under test taken at section line 10-10 in FIG. 9 in accordance with the present principles.

Referring to FIGS. 9 and 10, contacts 16 and 18 are made to contact the source region 48. Contact 26 is made to the drain region 52 (FIG. 6). FIG. 9 shows a top view, and FIG. 10 shows a cross-sectional view taken at section line 10-10 in FIG. 9. The contacts 16, 18 and 26 may include any suitable conductive material, such as polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

After the contact fill, a planarization process, such as a chemical mechanical polish (CMP) may be performed. The planarization process completes the contacts 16, 18 and 26. Further processing may include forming additional metal lines and connections. The completed test device 10 is shown in FIGS. 1 and 2.

Figure 11:
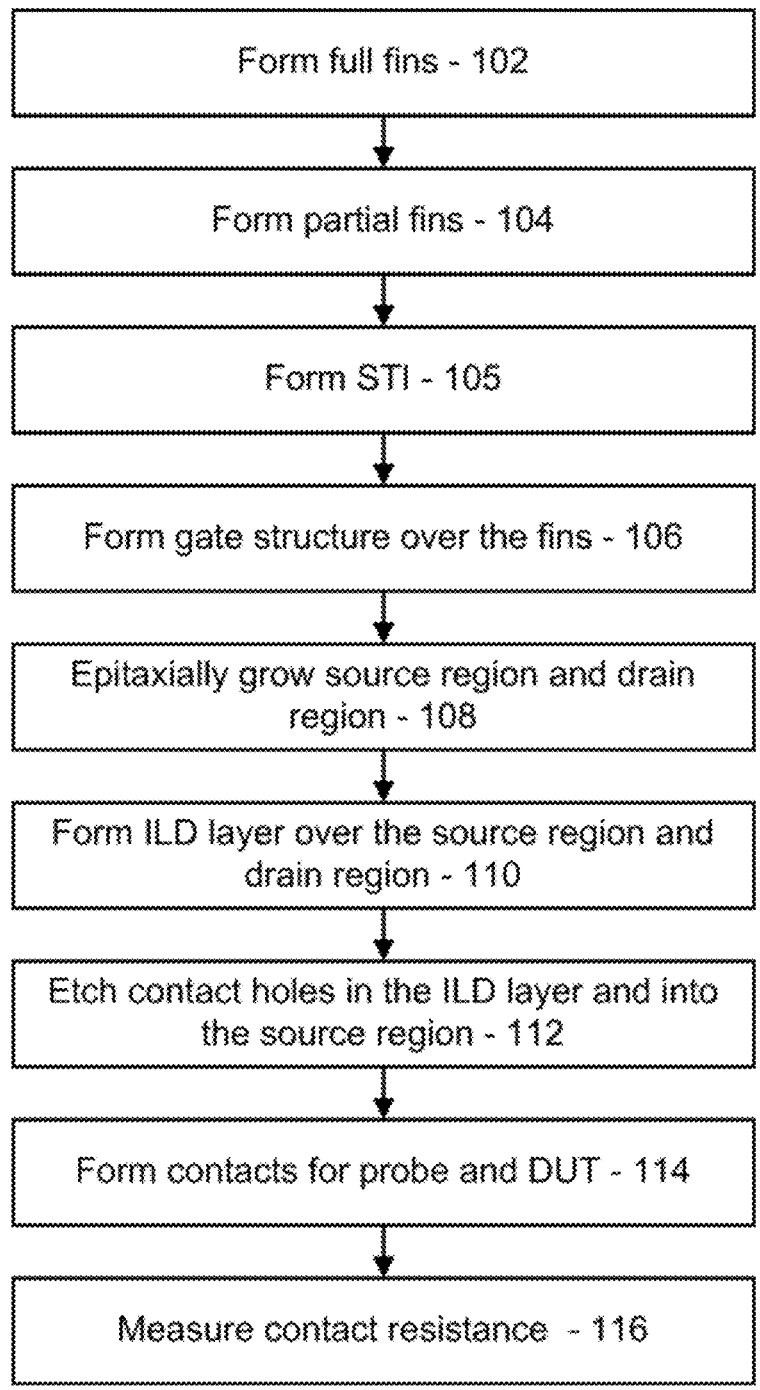
FIG. 11 is a block/flow diagram showing methods for fabricating a contact resistance test device in accordance with the present principles.

Referring to FIG. 11, methods for fabricating a contact resistance test device are illustratively shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a set of full fins are formed on a substrate. The fins are formed by etching the substrate in accordance with an etch mask to pattern the fins. In block 104, a subset of the set of full fins is cut to form a set of partial fins. The partial fins may include about one half the length of the full fins. In block 105, a shallow trench isolation (STI) region is formed at a base of the set of full fins and the set of partial fins.

In block 106, a gate structure is formed over the set of full fins and set of partial fins. The gate structure includes a gate conductor. The gate conductor of the gate structure is preferably formed over free edges of the set of partial fins.

In block 108, a source region is epitaxially grown over a first end of the set of full fins and the set of partial fins, and a drain region is epitaxially grown over a second end of the set of full fins. This forms completed devices over the full fins and a probe device over the partial fins that includes the source region and the partial fins. In block 110, an ILD layer is formed over the source region and the drain region. In block 112, contact holes are etched in the ILD layer and into the source region and the drain region. The source region and the drain region are etched to provide a level landing site for both the probe contact and the source contact. The landing site is preferably above or over the fin height (as opposed to next to or adjacent to the fins). The source region is etched to provide an interface with the source contact and the probe contact.

In block 114, contacts are formed for the DUT and the probe. A source contact is formed to the first end of the set of full fins, a drain contact is formed to the second end of the set of full fins, and a probe contact is formed to the first end of the set of partial fins for measuring contact resistance. These contacts are formed concurrently with a deposition and planarization of a conductive material. The source contact and the probe contact are separated by the ILD layer.

In block 116, the probe contact has an equal potential with the source region. A contact resistance is measured for devices formed by the set of full fins, wherein a voltage measured on the probe contact measures contact resistance when a drain-to-source current is flowing in the set of full fins.

Having described preferred embodiments for S/D contact resistance measurement on finFETs (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A contact resistance test device, comprising:
  a set of full fins providing channels between a source region and a drain region;
  a set of partial fins connected to the source region and electrically isolated from the drain region;
  a gate structure formed over the set of full fins and set of partial fins;
  a source contact connected to the source region; and a probe contact isolated from the source contact and connected to the source region wherein a voltage measured between the probe contact and the source contact measures contact resistance when a drain-to-source current is flowing in the set of full fins.

2. The device as recited in claim 1, wherein the probe contact includes an equal potential with the source region.

3. The device as recited in claim 1, wherein the source region includes an epitaxially grown region etched to provide an interface with the source contact and the probe contact.

4. The device as recited in claim 3, wherein the source contact and the probe contact connect to the epitaxially grown region over the set of full fins and the set of partial fins.

5. The device as recited in claim 1, further comprising a shallow trench isolation region formed at a base of the set of full fins and the set of partial fins.

6. The device as recited in claim 1, wherein a conductor of the gate structure is formed over free edges of the set of partial fins.

7. The device as recited in claim 1, wherein the source region includes a continuous epitaxial region connecting the set of full fins and the set of partial fins.

8. A contact resistance test device, comprising:
a semiconductor substrate;
a set of full fins etched into the substrate;
a set of partial fins etched from the set of full fins;
a source region epitaxially grown on first end portions of the set of full fins and the set of partial fins;
a drain region epitaxially grown on second end portions of the set of full fins, the full fins forming channels between the source region and the drain region, and the drain region being electrically isolated from the partial fins;
a gate structure formed over the set of full fins and the set of partial fins;
a source contact connected to the source region corresponding to the set of full fins; and
a probe contact connected to the source region corresponding to the set of partial fins, the probe contact being isolated from the source contact wherein a voltage measured between the probe contact and the source contact measures contact resistance when a drain-to-source current is flowing in the set of full fins.

9. The device as recited in claim 8, wherein the probe contact includes an equal potential with the source region.

10. The device as recited in claim 9, wherein the source region includes etched surfaces to provide an interface with the source contact and the probe contact.

11. The device as recited in claim 10, wherein the source contact and the probe contact connect to the source region over the set of full fins and the set of partial fins, respectively.

12. The device as recited in claim 9, further comprising a shallow trench isolation region formed at a base of the set of full fins and the set of partial fins.

13. The device as recited in claim 9, wherein a conductor of the gate structure is formed over free edges of the set of partial fins.

14. The device as recited in claim 9, wherein the source region includes a continuous epitaxial region connecting the set of full fins and the set of partial fins.

15. A method for fabricating a contact resistance test device, comprising:
forming a set of full fins;
cutting a subset of the set of full fins to form a set of partial fins;
forming a gate structure over the set of full fins and set of partial fins;
epitaxially growing a source region over a first end of the set of full fins and the set of partial fins and forming a drain region over a second end of the set of full fins, the set of partial fins being electrically isolated from the drain region;
forming an interlevel dielectric (ILD) layer over the source region and the drain region; etching contact holes in the ILD layer and into the source region and the drain region; and
forming a source contact to the first end of the set of full fins, a drain contact to the second end of the set of full fins and a probe contact to the first end of the set of partial fins for measuring contact resistance between the source contact and the drain contact.

16. The method as recited in claim 15, wherein the probe contact includes an equal potential with the source region, the method further comprising measuring the contact resistance for devices formed by the set of full fins.

17. The method as recited in claim 15, wherein etching contact holes includes etching the source region to provide an interface for the source contact and the probe contact.

18. The method as recited in claim 15, forming a shallow trench isolation region at a base of the set of full fins and the set of partial fins.

19. The method as recited in claim 15, wherein a conductor of the gate structure is formed over free edges of the set of partial fins.

20. The method as recited in claim 15, wherein a voltage measured between the probe contact and the source contact measures contact resistance when a drain-to-source current is flowing in the set of full fins.

* * * * *